(12) United States Patent
Wu et al.

(10) Patent No.: US 12,400,954 B2
(45) Date of Patent: Aug. 26, 2025

(54) SEMICONDUCTOR STRUCTURE AND METHOD OF MAKING THE SAME

(71) Applicant: ChangXin Memory Technologies, Inc., Hefei (CN)

(72) Inventors: Tieh-Chiang Wu, Hefei (CN); Lingxin Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/795,117

(22) PCT Filed: Jun. 10, 2022

(86) PCT No.: PCT/CN2022/098133
§ 371 (c)(1),
(2) Date: Jul. 25, 2022

(87) PCT Pub. No.: WO2023/226098
PCT Pub. Date: Nov. 30, 2023

(65) Prior Publication Data
US 2024/0213152 A1    Jun. 27, 2024

(30) Foreign Application Priority Data
May 23, 2022  (CN) .......................... 202210560785.2

(51) Int. Cl.
*H10B 12/00* (2023.01)
*H01L 21/768* (2006.01)
*H01L 23/528* (2006.01)

(52) U.S. Cl.
CPC ...... *H01L 23/528* (2013.01); *H01L 21/76883* (2013.01); *H10B 12/00* (2023.02); *H10B 12/315* (2023.02); *H10B 12/482* (2023.02)

(58) Field of Classification Search
CPC ............. H01L 27/108; H01L 27/10808; H01L 27/10814; H01L 27/10885;
(Continued)

(56) References Cited

U.S. PATENT DOCUMENTS

| 2015/0179651 A1* | 6/2015 | Park ...................... H10B 12/315 257/296 |
| 2019/0393357 A1* | 12/2019 | Chen .................. H10D 30/6757 |
| 2020/0119021 A1* | 4/2020 | Ma ....................... H10B 12/485 |

FOREIGN PATENT DOCUMENTS

KR    10-2012-003741 A    1/2019

\* cited by examiner

*Primary Examiner* — Phat X Cao
(74) *Attorney, Agent, or Firm* — Kilpatrick Townsend & Stockton LLP

(57) ABSTRACT

A semiconductor structure and a preparation method making it are disclosed. The semiconductor structure includes: a substrate, a bit line contact structure, a first epitaxial layer, a bit line and a second epitaxial layer. The structure includes bit line contact holes. The bit line contact structure is disposed in one of the bit line contact holes. The first epitaxial layer is epitaxially grown on the sidewalls of the bit line contact structure. The bit line includes a connection layer connected to the bit line contact structure. The second epitaxial layer is epitaxially grown on the sidewalls of the connection layer. The present disclosure can reduce the contact resistance and parasitic capacitance between the bit line contact structures and the bit lines, thereby improving the electrical performance of the semiconductor structure, thereby raising the reliability and yield of the semiconductor structure.

16 Claims, 14 Drawing Sheets

(58) Field of Classification Search
CPC .......... H01L 27/10888; H10B 12/0335; H10B 12/00; H10B 12/31; H10B 12/315; H10B 12/482; H10B 12/485
See application file for complete search history.

SEMICONDUCTOR STRUCTURE AND METHOD OF MAKING THE SAME

CROSS REFERENCES TO RELATED APPLICATIONS

This application claims the benefit of priority of Chinese patent application with the application number 202210560785.2, entitled "Semiconductor Structure and Method of Making the Same", filed with the China National Intellectual Property Administration on May 23, 2022, the contents of which are incorporated herein by reference in its entirety.

TECHNICAL FIELD

The present disclosure relates to the technical field of semiconductor integrated circuit manufacturing, and in particular, to a semiconductor structure and a fabrication method.

BACKGROUND

Dynamic Random Access Memory (DRAM for short) is a type of semiconductor memory commonly used in electronic devices such as computers, and includes multiple storage units, wherein, each storage unit includes: a storage capacitor, and a transistor electrically connected to the storage capacitor. The transistor includes a gate, source and drain regions. The gates of the transistors are used for electrical connection with the word lines. The source region of the transistor forms a bit line contact region to be electrically connected to the bit line through the bit line contact structure. The drain region of the transistor forms a storage node contact region to be electrically connected to the storage capacitor through the storage node contact structure.

However, with the development of semiconductor technology, the feature sizes of devices in integrated circuits are getting smaller. After the semiconductor process enters the deep sub-micron stage, the sizes of the DRAMs are also getting smaller, and the sizes of the bit line contact structures and the bit lines are also reduced accordingly. For example, the aspect ratios of the bit line contact holes are continuously increasing. After the bit line contact structures are formed, voids such as pores are likely to appear inside the bit line contact structures, which affect the electrical performance of the bit line contact structures. In addition, the sizes of the bit line contact structures and the bit lines are reduced continuously, therefore likely cause a larger contact resistance between the bit line contact structures and the bit lines, and the contact structures of the bit lines and the bit lines have adjacent conductive structures which add large parasitic capacitance, adversely affecting the electrical performance of the semiconductor devices.

SUMMARY

According to the current disclosure, a semiconductor structure includes a substrate, a bit line contact structure, a first epitaxial layer, a bit line, and a second epitaxial layer. The substrate includes bit line contact holes. The bit line contact structure is disposed in a bit line contact hole. The first epitaxial layer is formed on the sidewalls of the bit line contact structure. The bit line includes a connection layer connected to the bit line contact structure. The second epitaxial layer is disposed on the sidewalls of the connection layer.

According to some embodiments, the semiconductor structure further includes an isolation structure and a spacer. The isolation structure is located on the sidewalls of the first epitaxial layer. The spacers are located on the sidewalls of the second epitaxial layer and the sidewalls of the bit line not covered by the second epitaxial layer.

According to some embodiments, the semiconductor structure further includes: a first silicide layer and a second silicide layer. The first silicide layer is located on the sidewalls of the first epitaxial layer. The second silicide layer is located on the sidewalls of the second epitaxial layer.

According to some embodiments, the semiconductor structure further includes an isolation structure and a spacer. The isolation structure is located on the sidewalls of the first silicide layer. The spacers are located on the sidewalls of the second silicide layer and the sidewalls of the bit line not covered by the second epitaxial layer.

According to some embodiments, the bit line further includes a conductive layer on a side of the connection layer facing away from the substrate; wherein the first epitaxial layer and the second epitaxial layer are positive on the substrate The projection is at least within the range of the orthographic projection of the conductive layer on the substrate.

According to some embodiments, the orthographic projection of the second epitaxial layer on the substrate is located within the orthographic projection of the conductive layer on the substrate. There is a space between the orthographic projection of the second epitaxial layer on the substrate and the orthographic projection of the conductive layer on the substrate.

According to some embodiments, the semiconductor structure further includes a second silicide layer on the sidewalls of the second epitaxial layer; an orthographic projection of the second silicide layer on the substrate is located on the conductive layer at within the orthographic projection on the substrate.

According to some embodiments, the thickness of the first epitaxial layer is greater than the thickness of the second epitaxial layer.

According to some embodiments, the thickness of the second epitaxial layer is 2 nm 10 nm.

According to some embodiments, the thickness of the connection layer is 35%~65% of the thickness of the bit line.

According to some embodiments, the method of fabricating the semiconductor structure includes the following steps.

A substrate is provided, and a bit line contact structure and a bit line are sequentially formed on the substrate; the bit line includes a connection layer connected with the bit line contact structure.

The bit line contact structure and the sidewalls of the connection layer are etched back.

A first epitaxial layer is formed on the sidewalls of the bit line contact structure after the etching back, and a second epitaxial layer is formed on the sidewalls of the connection layer after the etching back.

According to some embodiments, the preparation method further includes the following steps.

An isolation structure is formed on the sidewalls of the first epitaxial layer.

Spacers are formed on sidewalls of the second epitaxial layer and sidewalls of the bit line not covered by the second epitaxial layer.

According to some embodiments, the preparation method further includes the following steps.

A first silicide layer is formed covering the sidewalls of the first epitaxial layer.

A second silicide layer covering the sidewalls of the second epitaxial layer is formed.

According to some embodiments, the preparation method further includes the following steps.

An isolation structure is formed on the sidewalls of the first silicide layer.

Spacers are formed on sidewalls of the second silicide layer and sidewalls of the bit line not covered by the second epitaxial layer.

According to some embodiments, the first epitaxial layer and the second epitaxial layer are epitaxially grown by an evaporation growth process, a molecular beam epitaxy process or a chemical vapor deposition process.

According to some embodiments, the sidewalls etching back thickness of the bit line contact structure and the connection layer is 2 nm~10 nm.

According to some embodiments, the bit line further includes a conductive layer on the side of the connection layer away from the substrate; the etching back the bit line contact structure and the sidewalls of the connection layer, after the formation of the After the conductive layer.

According to some embodiments, the first epitaxial layer is formed on the sidewalls of the bit line contact structure after etching back, and the first epitaxial layer is formed on the sidewalls of the connection layer after etching back. The orthographic projections of the epitaxial layer and the second epitaxial layer on the substrate are at least within the range of the orthographic projection of the conductive layer on the substrate.

Embodiments of the present disclosure may/at least have the following advantages:

In the embodiment of the present disclosure, by etching back the sidewalls of the bitline contact structure and the sidewalls of the connection layer in the bitline, the aforementioned pores can be exposed when the bitline contact structure and the connection layer are formed with internal pores, and the holes can be exposed during the epitaxy process. The pores are filled in the process of growing the first epitaxial layer and the second epitaxial layer, and the first epitaxial layer and the second epitaxial layer with smooth surfaces are formed. In this way, the existence of pores in the bit line contact structure and the connection layer can be avoided, and it is also beneficial to reduce the contact resistance between the bit line contact structure and the bit line through the first epitaxial layer and the second epitaxial layer, and reduce the bit line contact structure. and the parasitic capacitance between each of the bit lines and adjacent conductive structures.

In addition, by forming the first silicide layer on the sidewalls of the first epitaxial layer and forming the second silicide layer on the sidewalls of the second epitaxial layer, the embodiments of the present disclosure can also utilize the first silicide layer and the second silicide layer. The silicide layer effectively reduces the contact resistance between the bit line contact structure and the bit line, and the parasitic capacitance between each of the bit line contact structure and the bit line and the adjacent conductive structures. Therefore, the electrical properties of the semiconductor structure can be further improved, so as to further improve the reliability and yield of the semiconductor devices.

The details of one or more embodiments of the disclosure are set forth in the accompanying drawings and the description below. Other features, objects, and advantages of the present disclosure will become apparent from the description, drawings, and claims.

BRIEF DESCRIPTION OF THE DRAWINGS

In order to illustrate the technical solutions of the embodiments of the present disclosure more clearly, the following briefly introduces the accompanying drawings used in the description of the embodiments. Obviously, the accompanying drawings in the following descriptions disclose only examples. For those of ordinary skill in the art, the drawings of other embodiments can also be obtained according to these drawings without creative effort.

DETAILED DESCRIPTION OF THE PREFERRED EMBODIMENTS

Figure 1:
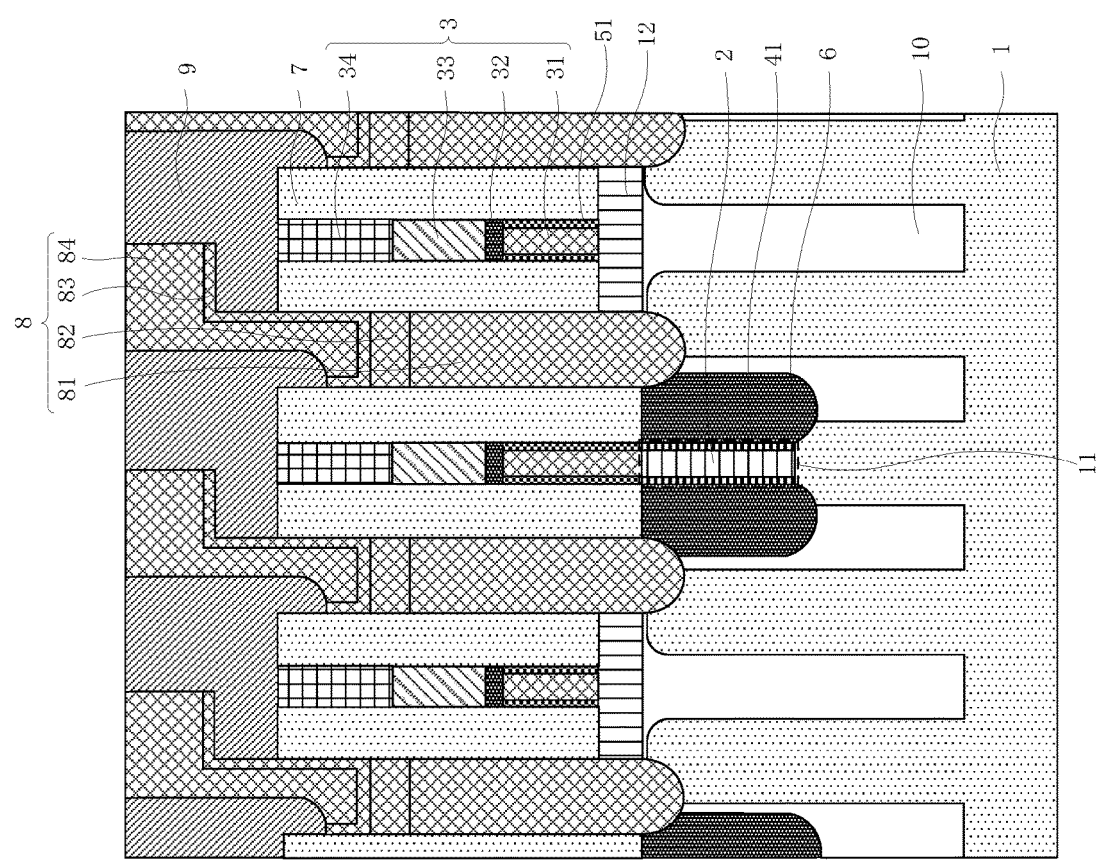
FIG. 1 is a schematic cross-sectional view of one semiconductor structure according to an embodiment.

In order to facilitate understanding of the present disclosure, the present disclosure will be described more fully hereinafter with reference to the related drawings. Embodiments of the present disclosure are presented in the accompanying drawings. However, the present disclosure may be embodied in many different forms and is not limited to the embodiments described herein. Rather, these embodiments are provided so that this disclosure will be thorough and complete.

Unless otherwise defined, all technical and scientific terms used herein have the same meaning as commonly understood by one of ordinary skill in the art to which this disclosure belongs. The terms used herein in the specification of the present disclosure are for the purpose of describing specific embodiments only, and are not intended to limit the present disclosure.

It will be understood that when an element or layer is referred to as being "on," "adjacent to," "connected to," or "coupled to" other elements or layers, it can be directly on the other elements or layers may be on, adjacent to, connected or coupled to other elements or layers, or intervening elements or layers may be present. In contrast, when an element is referred to as being "directly on," "directly adjacent to," "directly connected to," or "directly coupled to" other elements or layers, there are no intervening elements or layers present.

Spatial relational terms such as "under", "below", "below", "under", "above", "above", etc., in This may be used to describe the relationship of one element or feature to other elements or features shown in the figures. It should be understood that in addition to the orientation shown in the figures, the spatially relative terms encompass different orientations of the device in use and operation. For example, if the device in the figures is turned over, elements or features described as "below" or "beneath" or "under" other elements or features would then be oriented "above" the other elements or features. Thus, the exemplary terms "below" and "under" can encompass both an orientation of above and below. In addition, the device may also be otherwise oriented (e.g., rotated 90 degrees or at other orientations) and the spatial descriptors used herein interpreted accordingly.

As used herein, the singular forms "a," "an," and "the/the" can include the plural forms as well, unless the context clearly dictates otherwise. It should also be understood that the terms "comprising/comprising" or "having" etc. designate the presence of stated features, integers, steps, operations, components, parts or combinations thereof, but do not preclude the presence or addition of one or more Possibilities of other features, integers, steps, operations, components, parts or combinations thereof. Also, in this specification, the term "and/or" includes any and all combinations of the associated listed items.

Embodiments of the invention are described herein with reference to cross-sectional illustrations that are schematic illustrations of idealized embodiments (and intermediate structures) of the present disclosure, such that variations in the shapes shown may be contemplated due, for example, to manufacturing techniques and/or tolerances. Accordingly, embodiments of the present disclosure should not be limited to the particular shapes of the regions shown herein, but include shape deviations due, for example, to manufacturing techniques. The regions shown in the figures are schematic in nature and their shapes do not represent the actual shape of a region of a device and do not limit the scope of the present disclosure.

Referring to FIG. 1, some embodiments of the present disclosure provide a semiconductor structure. The semiconductor structure includes: a substrate 1, a bit line contact structure 2, a bit line 3, a first epitaxial layer 41 and a second epitaxial layer 51. The substrate 1 includes a bit line contact (BLC for short) hole 11. The bit line contact structure 2 is disposed in the bit line contact hole 11. The first epitaxial layer 41 is disposed on the sidewalls of the bit line contact structure 2. The bit line 3 includes a connection layer 31 connected to the bit line contact structure 2. The second epitaxial layer 51 is disposed on the sidewalls of the connection layer 31.

In some embodiments, the substrate 1 may include semiconductor materials, insulating materials, conductor materials, or any combination thereof. The substrate 1 may have a single-layer structure or a multi-layer structure. For example, the substrate 1 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an arsenic Indium phosphide (InAs) substrates, indium phosphide (InP) substrates or other III/V semiconductor substrates or II/VI semiconductor substrates. Alternatively, and also for example, the substrate 1 may be a layered substrate comprising, for example, Si/SiGe, Si/SiC, silicon-on-insulator (SOI), or silicon-germanium-on-insulator.

Optionally, the substrate 1 is a silicon substrate or a silicon-based substrate, the substrate 1 has a shallow trench isolation structure 10, and the shallow trench isolation structure 10 isolates an active region in the substrate 1. The shallow trench isolation structure 10 is, for example, a silicon oxide (SiO 2) isolation structure. The shallow trench isolation structure 10 can isolate a plurality of active regions arranged in an array in the substrate 1. The bit line contact hole 11 is provided in the active region of the substrate 1. The bit line contact structures 2 are filled in the corresponding bit line contact holes 11. The bit line contact hole 11 may be a round hole, a square hole or a special-shaped hole. The embodiment of the present disclosure does not limit the shape and size of the bit line contact hole 11.

Optionally, the bit line 3 includes a connection layer 31, a first barrier layer 32, a conductive layer 33 and a top isolation layer 34 which are arranged in sequence along a direction away from the substrate 1.

In some embodiments, the connection layer 31 of the bit line 3 may be a doped polysilicon layer or a silicon germanium layer with a conductive function. The bit line contact structure 2 may be the same as or different from the connection layer 31 in the bit line 3.

In one example, the connection layer 31 in the bit line 3 and the bit line contact structure 2 are both doped polysilicon layers, and the doping concentration of the two can be the same.

In one example, the first barrier layer 32 is a titanium nitride layer or a titanium layer.

In one example, the conductive layer 33 is a tungsten metal layer, a copper metal layer, or a gold metal layer.

In one example, the top isolation layer 34 is a silicon nitride layer or a silicon oxynitride layer.

In one example, the part of the bit line 3 other than the connection layer 31 connecting with the bit line contact structure 2 is insulated from the substrate 1 by the dielectric layer 12. Optionally, the dielectric layer 12 may be an insulating layer such as a silicon nitride layer, a silicon oxide layer, or a silicon oxynitride layer. The thickness of the dielectric layer 12 can be selected and set according to actual requirements.

In some embodiments, the thickness of the connection layer 31 is 35%~65% of the thickness of the bit line 3. For example, the thickness of the connection layer 31 is 35%, 40%, 45%, 50%, 55%, 60% or 65% of the thickness of the bit line 3.

In some embodiments, the first epitaxial layer 41 and the second epitaxial layer 51 may be formed by an evaporation growth process, a molecular beam epitaxy process or a chemical vapor deposition process equivalent to epitaxial growth on the corresponding sidewalls. In addition, the first epitaxial layer 4 and the second epitaxial layer 5 may be epitaxial layers of the same material, or may be epitaxial layers of different materials. The first epitaxial layer 4 and the second epitaxial layer 5 may be formed simultaneously or in steps.

Optionally, the first epitaxial layer 41 and the second epitaxial layer 51 may be a single crystal silicon layer or a silicon germanium layer, respectively. But it doesn't stop there.

Optionally, the orthographic projections of the first epitaxial layer 41 and the second epitaxial layer 51 on the substrate 1 are at least within the range of the orthographic projection of the conductive layer 33 on the substrate 1.

Here, the orthographic projections of the first epitaxial layer 41 and the second epitaxial layer 51 on the substrate 1 are at least located within the orthographic projection of the conductive layer 33 on the substrate 1, including: the first epitaxial layer 41 and the second epitaxial layer 51 each include a portion directly under (i.e. vertically below) the conductive layer 33, or, the first epitaxial layer 41 and/or the second epitaxial layer 51 include a portion directly under (i.e. vertically below) the conductive layer 33, and also includes the portion whose orthographic projection is located outside the orthographic projection of the conductive layer 33 on the substrate 1.

In one example, the orthographic projection of the second epitaxial layer 51 on the substrate 1 is located within the orthographic projection of the conductive layer 33 on the substrate 1, and there is a space between the borders of the orthographic projection of the second epitaxial layer 51 on the substrate 1 and the orthographic projection of the conductive layer 33 on the substrate 1.

From the above, the thickness of the first epitaxial layer 41 and the thickness of the second epitaxial layer 51 may be the same or different.

In one example, the thickness of the first epitaxial layer 41 is equal to the thickness of the second epitaxial layer 51.

In one example, the thickness of the first epitaxial layer 41 is greater than the thickness of the second epitaxial layer 51.

Optionally, the thickness of the second epitaxial layer 51 ranges from 2 nm to 10 nm. The thickness of the second epitaxial layer 51 may be, for example, 2 nm, 3 nm, 4 nm, 5 nm, 6 nm, 7 nm, 8 nm, 9 nm, or 10 nm.

Please continue to refer to FIG. 1, in some embodiments, the semiconductor structure further includes: an isolation structure 6 and a spacer 7. The isolation structure 6 is disposed on the sidewalls of the first epitaxial layer 41. The sidewalls spacers 7 are disposed on the sidewalls of the second epitaxial layer 51 and the sidewalls of the bit lines 3 not covered by the second epitaxial layer 51.

Optionally, the isolation structure 6 is formed of a dielectric material with a higher dielectric constant, such as a single-layer dielectric layer, or a stack of multiple dielectric layers. The isolation structure 6 is used to insulate the corresponding bit line contact structure 2, and the isolation structure 6 is disposed on the sidewalls of the first epitaxial layer 41; the first epitaxial layer 41 can be a component of an equivalent bit line contact structure part to ensure that the size of the equivalent bit line contact structure can meet the design requirements. (The equivalent bit line contact structure may include the bit line contact structure 2 and the first epitaxial layer 41 together).

Optionally, the sidewalls 7 may be formed of a dielectric material with a lower dielectric constant, such as a single-layer dielectric layer, or a stack of multiple dielectric layers. The spacers 7 are used to insulate the corresponding bit lines 3, and the spacers 7 cover the second epitaxial layer 51 and the side walls of the bit lines 3; that is to say, the second epitaxial layer 51 can be a component of an equivalent bit line part to ensure that the size of the equivalent bit line can meet the design requirements. (The equivalent bit line may include the bit line 3 and the second epitaxial layer 51 together). In addition, the thickness of the side wall 7 can be selected and set according to actual needs.

In one example, the isolation structure 6 and the spacer 7 are respectively formed by stacking a first silicon nitride layer, a silicon oxide layer and a second silicon nitride layer.

Please continue to refer to FIG. 1, in some embodiments, the semiconductor structure further includes: a storage node contact structure 8. The storage node contact structure 8 is insulated from the first epitaxial layer 41 by the isolation structure 6, and the storage node contact structure 8 is insulated from the second epitaxial layer 51 by the spacer 7.

Optionally, the storage node contact structure 8 includes a first conductive layer 81, a conductive transition layer 82, a second barrier layer 83 and a second conductive layer 84 that are stacked in sequence along a direction away from the substrate 1. But it doesn't stop there. The first conductive layer 81 is, for example, a doped polysilicon layer. The conductive transition layer 82 is, for example, a cobalt silicide layer. The second barrier layer 83 is, for example, a titanium nitride layer. The second conductive layer 84 is, for example, a tungsten metal layer.

Optionally, an insulating layer 9 is further provided between adjacent storage node contact structures 8. The insulating layer 9 may be a silicon nitride layer, for example, one or more layers of silicon nitride layers. Here, the insulating layer 9 refers to the entire insulating portion between adjacent storage node contact structures 8.

In the embodiment of the present disclosure, by etching back the sidewalls of the bitline contact structure 2 and the sidewalls of the connection layer 31 in the bitline 3, internal pores can be formed in the bitline contact structure 2 and the connection layer 31 in case (due to the preparation process) The aforementioned pores are easily exposed without causing unnecessary pores), and the pores are filled during the epitaxial growth of the first epitaxial layer 41 and the second epitaxial layer 51, and the first epitaxial layers 41 and 51 with smooth surfaces are formed. The second epitaxial layer 51. In this way, voids in the bit line contact structure 2 and the connection layer 31 can be avoided, and the contact resistance between the bit line contact structure 2 and the bit line 3 can be reduced by the first epitaxial layer 41 and the second epitaxial layer 51, and the parasitic capacitance between each of the bit line contact structure 2 and the bit line 3 and the adjacent conductive structures is reduced. Thereby, the electrical properties of the semiconductor structure are improved, so as to improve the reliability and yield of the semiconductor devices.

In addition, in the embodiment of the present disclosure, by controlling the epitaxial thicknesses of the first epitaxial layer 41 and the second epitaxial layer 51, it is possible to not only reduce the size of the bit line while ensuring the design dimensions of the bit line 3 and the bit line contact hole 11 remain unchanged The contact resistance between 3 and the bit line contact structure 2 can also increase the distance between the bit line contact structure 2 and the bit line 3 and the adjacent conductive structures, so as to effectively reduce the parasitic capacitance. Therefore, the electrical properties of the semiconductor devices can be further improved, so as to further improve the reliability and yield of the semiconductor devices.

Figure 2:
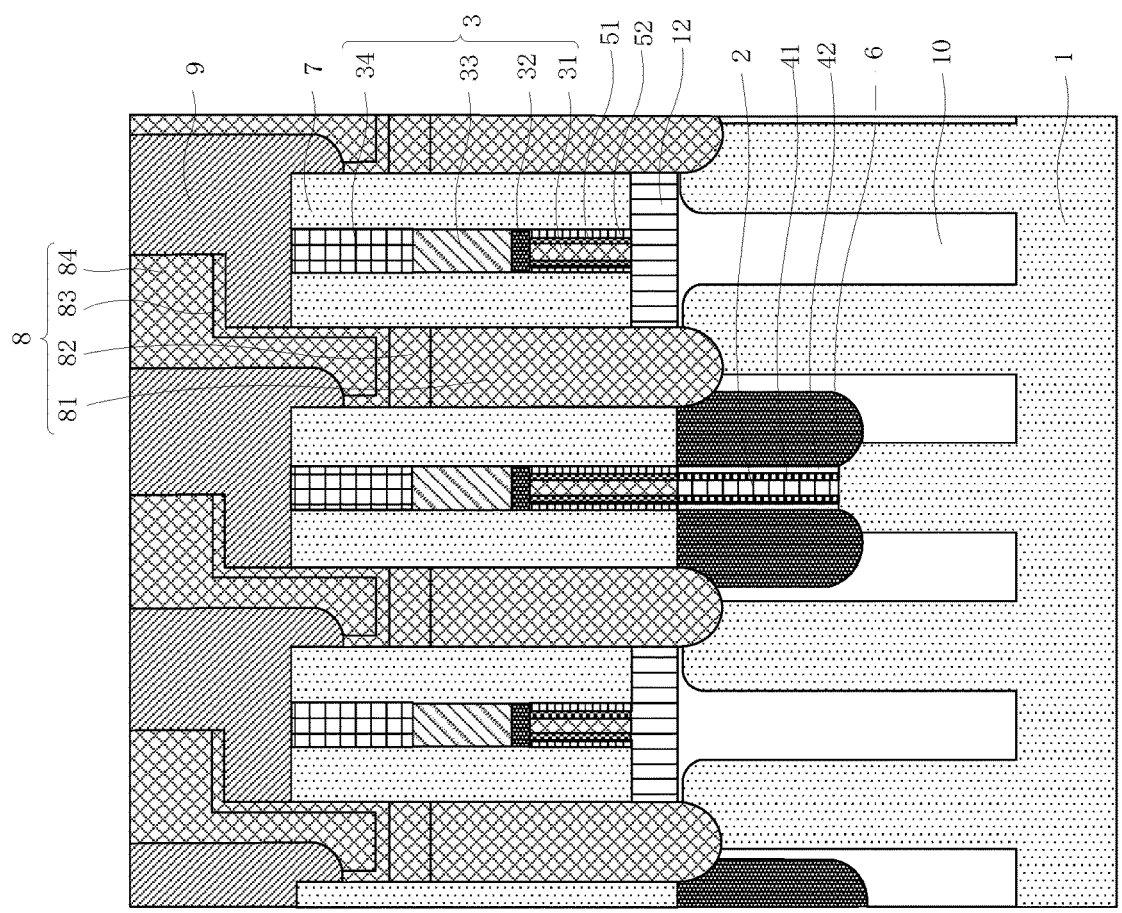
FIG. 2 is a schematic cross-sectional view of one semiconductor structure according to an embodiment.

Referring to FIG. 2, some embodiments of the present disclosure further provide a semiconductor structure. The semiconductor structure includes: a substrate 1, a bit line contact structure 2, a bit line 3, a first epitaxial layer 41, a second epitaxial layer 51, a first silicide layer 42 and a second silicide layer 52. The arrangement of the substrate 1, the bit line contact structure 2, the bit line 3, the first epitaxial layer 41 and the second epitaxial layer 51 may refer to the relevant features in the foregoing embodiments, and will not be described in detail here. The first silicide layer 42 is located on the sidewalls of the first epitaxial layer 41. The second silicide layer 52 is located on the sidewalls of the second epitaxial layer 51.

Based on this, in the embodiment in which the semiconductor structure further includes the isolation structure 6 and the spacer 7, the isolation structure 6 is located on the sidewalls of the first silicide layer 42. The sidewalls spacers 7 are located on the sidewalls of the second silicide layer 52 and the sidewalls of the bit line 3 not covered by the second epitaxial layer 51. In addition, for the structures of the isolation structure 6 and the side walls 7, reference may be made to the relevant records in some of the foregoing embodiments, and will not be described in detail again.

Correspondingly, the bit line contact structure 2, the first epitaxial layer 41 and the first silicide layer 42 can jointly form an equivalent bit line contact structure. The bit line 3, the second epitaxial layer 51 and the second silicide layer 52 may together form an equivalent bit line.

In the embodiment of the present disclosure, the first silicide layer 42 is formed on the sidewalls of the first epitaxial layer 41, and the second silicide layer 52 is formed on the sidewalls of the second epitaxial layer 51, and the first silicide layer 42 can also be used. and the second silicide layer 52 effectively reduce the contact resistance between the bit line contact structure 2 and the bit line 3 and the parasitic capacitance between the bit line contact structure 2 and the bit line 3 and the adjacent conductive structures. Therefore, the electrical properties of the semiconductor structure can be further improved, so as to further improve the reliability and yield of the semiconductor devices.

The first silicide layer 42 and the second silicide layer 52 may be the same silicide layer, or may be different silicide layers. Correspondingly, the first silicide layer 42 and the second silicide layer 52 may be formed simultaneously or in separate steps. This embodiment of the present disclosure does not limit this.

In some embodiments, the orthographic projections of the first silicide layer 42 and the second silicide layer 52 on the substrate 1 are at least within the range of the orthographic projection of the conductive layer 33 on the substrate 1.

Optionally, the orthographic projection of the second silicide layer 52 on the substrate 1 is located within the orthographic projection of the conductive layer 33 on the substrate 1. For example, there is also a space between the orthographic boundary of the second silicide layer 52 on the substrate 1 and the orthographic boundary of the conductive layer 33 on the substrate 1.

In the embodiment of the present disclosure, by setting the thicknesses of the first silicide layer 42 and the second silicide layer 52, it is possible to not only reduce the size of the bit line 3 while ensuring the design dimensions of the bit line 3 and the bit line contact hole 11 remain unchanged. The contact resistance with the bit line contact structure 2 can also increase the distance between the bit line contact structure 2 and the bit line 3 and adjacent conductive structures, so as to effectively reduce the parasitic capacitance.

Please continue to refer to FIG. 2, in the embodiment in which the semiconductor structure further includes the storage node contact structure 8, the storage node contact structure 8 is insulated from the first silicide layer 42 by the isolation structure 6, and the storage node contact structure 8 is connected to the storage node contact structure 8 through the spacer 7. The second silicide layer 52 is insulating. An insulating layer 9 is further provided between the adjacent storage node contact structures. For the structures of the storage node contact structure 8 and the insulating layer 9, reference may be made to the relevant descriptions in some of the foregoing embodiments, which will not be described in detail here.

Figure 3:
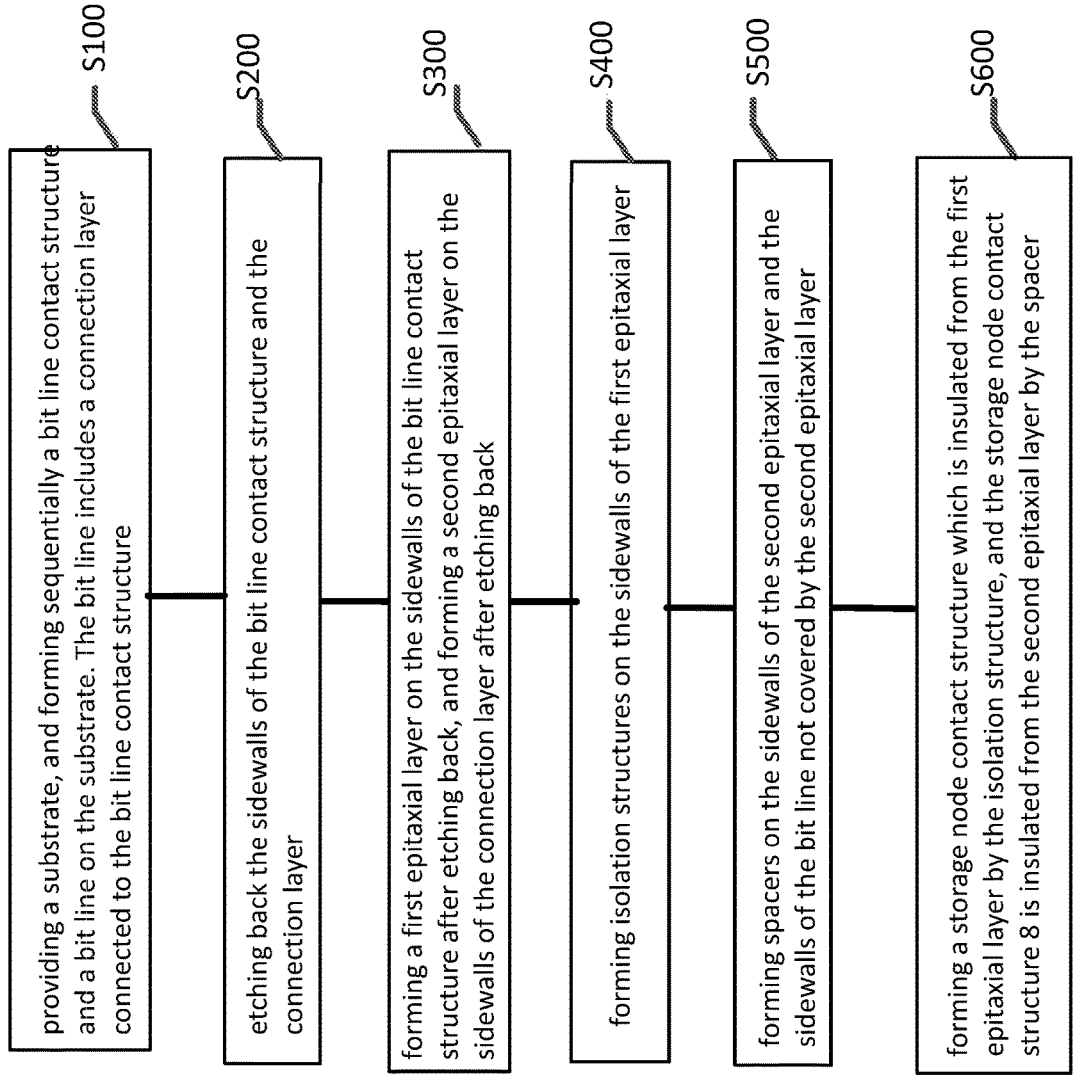
FIG. 3 is a schematic flowchart of a method for fabricating the semiconductor structure shown in FIG. 1.

Referring to FIG. 3, which shows a schematic flowchart of a method for fabricating the semiconductor structure shown in FIG. 1. The preparation method includes the following steps.

S100, providing a substrate, and forming sequentially a bit line contact structure and a bit line on the substrate. The bit line includes a connection layer connected to the bit line contact structure.

S200, etching back the sidewalls of the bit line contact structure and the connection layer.

S300, forming a first epitaxial layer on the sidewalls of the bit line contact structure after etching back, and forming a second epitaxial layer on the sidewalls of the connection layer after etching back.

In the embodiment of the present disclosure, by etching back the sidewalls of the bitline contact structure and the sidewalls of the connection layer in the bitline, the aforementioned pores can be exposed when the bitline contact structure and the connection layer are formed with internal pores, and the holes can be exposed during the epitaxy process. The pores are filled in the process of growing the first epitaxial layer and the second epitaxial layer, and the first epitaxial layer and the second epitaxial layer with smooth surfaces are formed. In this way, the existence of pores in the bit line contact structure and the connection layer can be avoided, and it is also beneficial to reduce the contact resistance between the bit line contact structure and the bit line through the first epitaxial layer and the second epitaxial layer, and reduce the bit line contact structure. and the parasitic capacitance between each of the bit lines and adjacent conductive structures.

Figure 4:
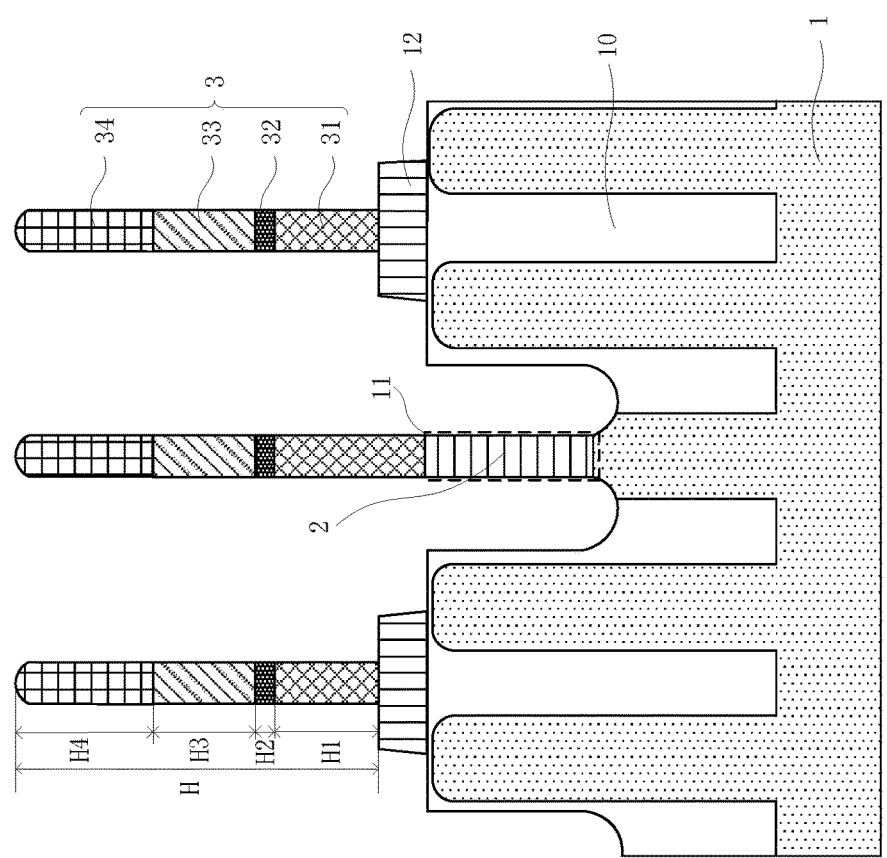
FIG. 4 is a schematic cross-sectional view of a structure obtained after forming a bit line contact structure and a bit line according to an embodiment.

In step S100, referring to S100 in FIG. 3 and FIG. 4, a substrate 1 is provided, and a bit line contact structure 2 and a bit line 3 are sequentially formed on the substrate 1. The bit line 3 includes a connection layer 31 connected to the bit line contact structure 2.

In one example, the substrate 1 includes, but is not limited to, a silicon substrate or a silicon-based substrate. The substrate 1 has a shallow trench isolation structure 10, and the shallow trench isolation structure 10 isolates an active region within the substrate 1. Optionally, the shallow trench isolation structure 10 is a silicon oxide ($SiO_2$) isolation structure. The shallow trench isolation structure 10 can isolate a plurality of active regions arranged in an array in the substrate 1.

It can be understood that, in some embodiments, please continue to refer to FIG. 4, a bit line contact (Bit line contact, BLC for short) 11 is provided in the active area on the substrate 1, and the bit line contact structure 2 is filled in the corresponding bit line inside the line contact hole 11. The bit line contact hole 11 may be a round hole, a square hole or a special-shaped hole. The embodiment of the present disclosure does not limit the shape and size of the bit line contact hole 11.

In some embodiments, the connection layer 31 of the bit line 3 may be formed by using doped polysilicon, silicon germanium and other materials with conductive functions. The material of the bit line contact structure 2 may be the same as or different from the material of the connection layer 31 in the bit line 3. Alternatively, the material of the bit line contact structure 2 can be the same as the material of the connection layer 31 in the bit line 3, but the doping concentration of the two can be different, the etching rates of the two can be different when they are formed, and the sidewalls of the two can be etched back. The etching rate can also be different at different times, and the specific setting can be selected according to actual needs. This embodiment of the present disclosure does not limit this, and also does not limit the shapes of the bit line contact structure 2 and the connection layer 31 after being etched.

In an example, please continue to refer to FIG. 4, the part of the bit line 3 other than the connection layer 31 connecting with the bit line contact structure 2 is insulated from the substrate 1 by the dielectric layer 12. Optionally, the dielectric layer 12 may be an insulating layer such as a silicon nitride layer, a silicon oxide layer, or a silicon oxynitride layer. The thickness of the dielectric layer 12 can be selected and set according to actual requirements.

In one example, the connection layer 31 in the bit line 3 and the bit line contact structure 2 are both doped polysilicon layers, and the doping concentration of the two can be the same.

It can be understood that, in some embodiments, please continue to refer to FIG. 4, the bit line 3 further includes a first barrier layer 32, a conductive layer 33 and a top isolation layer 34 which are sequentially arranged on one side of the connection layer 31 along the direction away from the substrate 1.

Optionally, the first barrier layer 32 includes, but is not limited to, a titanium nitride layer. For example, the first barrier layer 32 may also be a titanium layer.

Optionally, the conductive layer 33 includes, but is not limited to, a tungsten metal layer. For example, the conductive layer 33 can also be a copper metal layer or a gold metal layer.

Optionally, the top isolation layer 34 includes, but is not limited to, a silicon nitride layer. For example, the top isolation layer 34 may also be a silicon oxynitride layer.

The above-mentioned first barrier layer 32, conductive layer 33 and top isolation layer 34 can be obtained by patterning each material layer through a patterning process after depositing the corresponding material layer. Optionally, the top isolation layer 34 may be formed by using a hard mask material to be used as a hard mask during the formation of the conductive layer 33, the first barrier layer 32 and the connection layer 31.

Here, the deposition process includes but is not limited to low pressure chemical vapor deposition (LPCVD), high density plasma chemical vapor deposition (HDPCVD), plasma enhanced chemical vapor deposition (PECVD) or atomic layer chemical vapor deposition (ALCVD) and other processes. The patterning process includes but is not limited to wet etching or dry etching, wherein the dry etching at least includes reactive ion etching (RIE), inductively coupled plasma etching (ICP) or high concentration plasma etching (HDP)) any of them.

In some embodiments, the thickness of the connection layer 31 is 35%~65% of the thickness of the bit line 3. For example, the thickness of the connection layer 31 is 35%, 40%, 45%, 50%, 55%, 60% or 65% of the thickness of the bit line 3.

Here, please refer to FIG. 4, in the example in which the bit line 3 adopts the aforementioned structure, the height H of the bit line 3 refers to the sum of the heights of the connection layer 31, the first barrier layer 32, the conductive layer 33 and the top isolation layer 34 That is, H=H1+H2+H3+H4, wherein H1 is the thickness of the connecting layer 31, H2 is the thickness of the first barrier layer 32, H3 is the thickness of the conductive layer 33, and H4 is the thickness of the top isolation layer 34.

Figure 5:
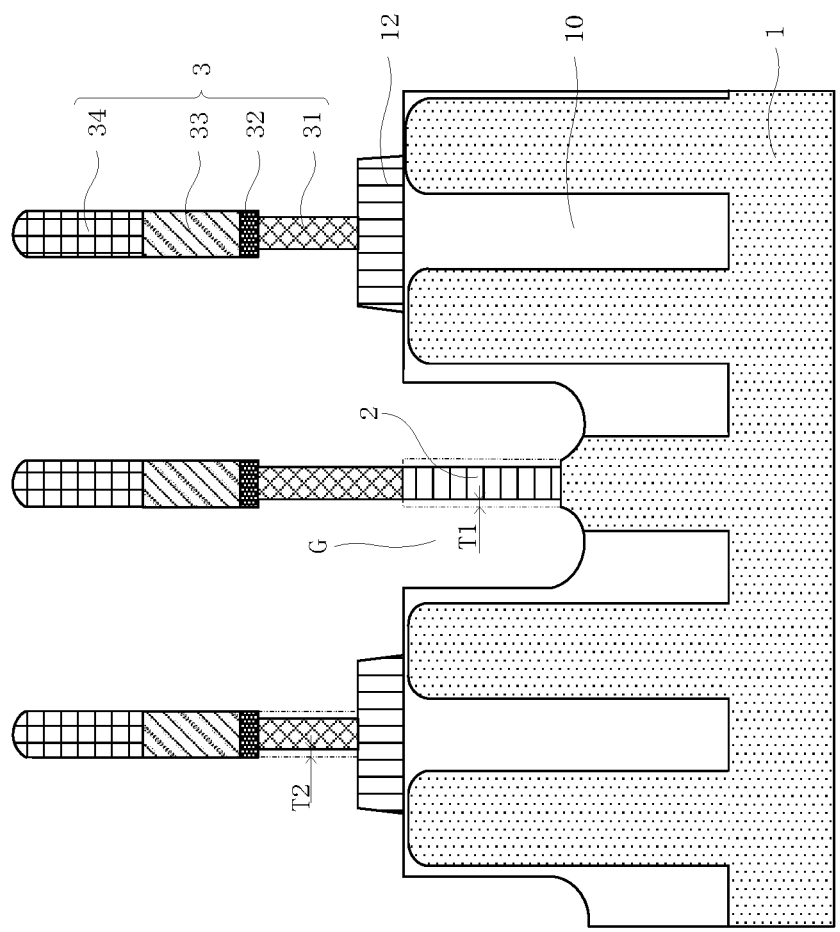
FIG. 5 is a schematic cross-sectional view of the structure obtained after the bitline contact structure and the sidewalls of the connection layer are etched back according to an embodiment.

In step S200, referring to S200 in FIG. 3 and FIG. 5, the sidewalls of the bit line contact structure 2 and the connection layer 31 are etched back.

Here, according to the formation materials of the bit line contact structure 2 and the connection layer 31, an etching process can be reasonably selected for etching back. The etching process includes but is not limited to wet etching or dry etching, wherein the dry etching may at least include reactive ion etching (RIE), inductively coupled plasma etching (ICP) or high concentration plasma etching (HDP) either.

In addition, the etching back thicknesses of the sidewalls of the bit line contact structure 2 and the connection layer 31 can be selected according to actual requirements. In addition, the etching back thicknesses of the sidewalls of the bit line contact structure 2 and the connection layer 31 may be the same or different.

Optionally, the etching back thickness of the sidewalls of the bit line contact structure 2 and the connection layer 31 ranges from 2 nm to 10 nm. For example, referring to FIG. 2, the etching back thickness T1 of the sidewalls of the bit line contact structure 2 is 2 nm, 3 nm, 4 nm, 5 nm, 6 nm, 7 nm, 8 nm, 9 nm or 10 nm. For example, the etching back thickness T2 of the sidewalls of the connection layer 31 is 2 nm, 3 nm, 4 nm, 5 nm, 6 nm, 7 nm, 8 nm, 9 nm or 10 nm.

In addition, please understand with reference to FIG. 5, the bit line contact structure 2 is formed in the bit line contact hole 11, and the etching of the sidewalls of the bit line contact structure 2 can be performed by the trench G formed on the side thereof, for example, the trench G is used to fill the isolation material to form the isolation structure corresponding to the bit line contact structure 2.

Figure 6:
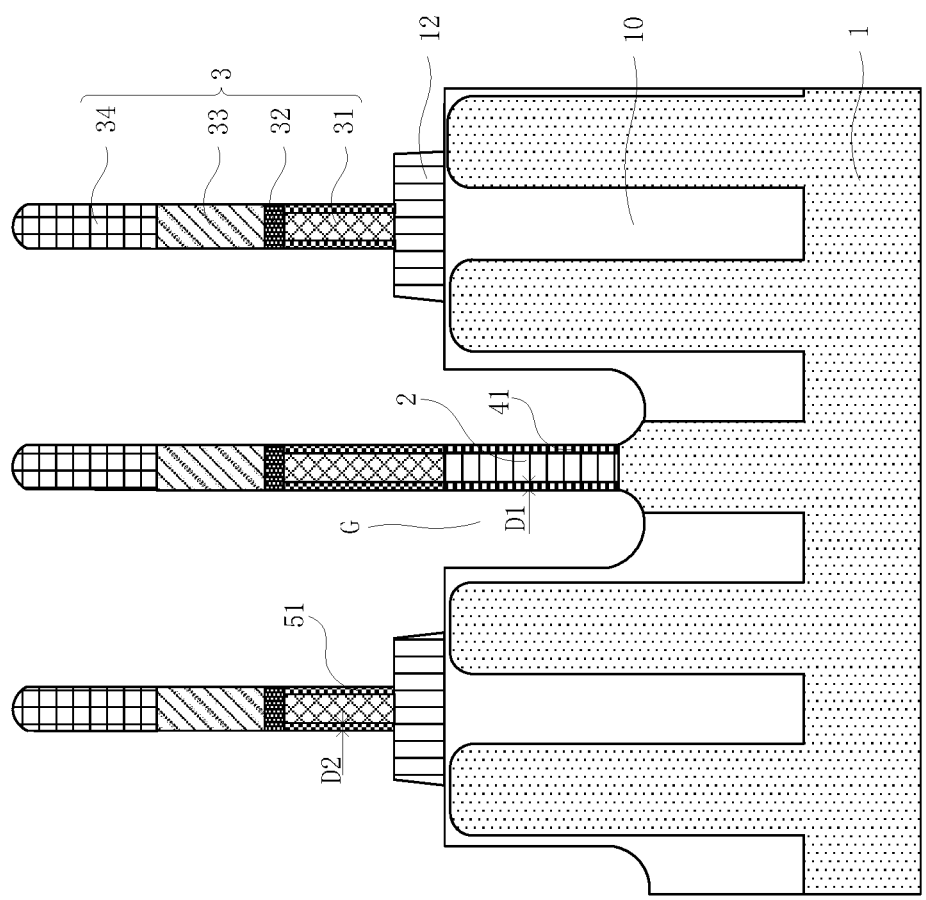
FIG. 6 is a schematic cross-sectional view of a structure obtained after forming a first epitaxial layer and a second epitaxial layer according to an embodiment.

In step S300, referring to S300 in FIG. 3 and FIG. 6, a first epitaxial layer 41 is formed on the sidewalls of the bit line contact structure 2 after etching back, and a second epitaxial layer 41 is formed on the sidewalls of the connection layer 31 after etching back. Epitaxial layer 51.

Here, the first epitaxial layer 41 and the second epitaxial layer 51 may be epitaxial layers of the same material, or may be epitaxial layers of different materials. Correspondingly, the first epitaxial layer 41 and the second epitaxial layer 51 may be formed simultaneously or in steps. This embodiment of the present disclosure does not limit this.

Optionally, the first epitaxial layer 41 and the second epitaxial layer 51 are formed by epitaxial growth using an evaporation growth process, a molecular beam epitaxy process or a chemical vapor deposition process. But it doesn't stop there. The first epitaxial layer 41 and the second epitaxial layer 51 are grown through an epitaxial process to form a smooth surface.

Figure 7:
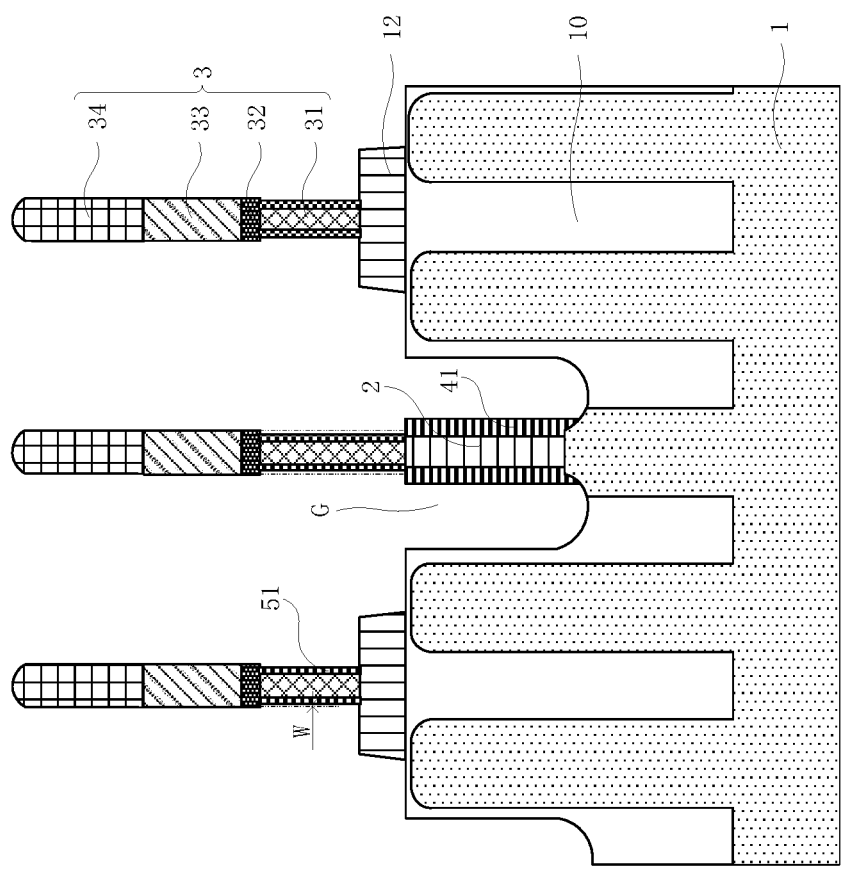
FIG. 7 is a schematic cross-sectional view of a structure obtained after forming a first epitaxial layer and a second epitaxial layer according to another embodiment.

In some embodiments, please understand with reference to FIG. 6 and FIG. 7, the bit line 3 further includes a conductive layer 33 on the side of the connection layer 31 away from the substrate 1. The first epitaxial layer 41 is formed on the sidewalls after the bit line contact structure 2 is etched back, and the second epitaxial layer 51 is formed on the sidewalls after the connection layer 31 is etched back. The orthographic projection of the epitaxial layer 51 on the substrate 1 is at least within the range of the orthographic projection of the conductive layer 33 on the substrate 1.

Here, the orthographic projections of the first epitaxial layer 41 and the second epitaxial layer 51 on the substrate 1 are at least within the orthographic projection range of the conductive layer 33 on the substrate 1, including: the first epitaxial layer 41 and the second epitaxial layer 51 each includes a portion directly below (i.e. vertically below) the conductive layer 33, or, the first epitaxial layer 41 and/or the second epitaxial layer 51 include a portion directly under (i.e. vertically below) the conductive layer 33, and also includes the portion whose orthographic projection is located outside the orthographic projection of the conductive layer 33 on the substrate 1.

In one example, as shown in FIG. 7, the orthographic projection of the second epitaxial layer 51 on the substrate 1 is located within the orthographic projection of the conductive layer 33 on the substrate 1. There is a gap W between the orthographic projection of the second epitaxial layer 51 on the substrate and the orthographic projection of the conductive layer 33 on the substrate 1.

From the above, it can be understood with reference to FIGS. 6 and 7, the thickness D1 of the first epitaxial layer 41 and the thickness D2 of the second epitaxial layer 51 may be the same or different. In one example, referring to FIG. 6, the thickness D1 of the first epitaxial layer 41 is equal to the thickness D2 of the second epitaxial layer 51. In one example, referring to FIG. 7, the thickness D1 of the first epitaxial layer 41 is greater than the thickness D2 of the second epitaxial layer 51. Here, the thickness D1 of the first epitaxial layer 41 is greater than the thickness D2 of the second epitaxial layer 51, which can be achieved by adjusting the corresponding process parameters, such as controlling the growth temperature, the pressure in the reaction chamber, the concentration of the reaction gas source and the gas flow rate, etc. Thus, precise control of the thickness of the epitaxial layer is achieved.

In the embodiment of the present disclosure, by setting the thicknesses of the first epitaxial layer 41 and the second epitaxial layer 51, it is possible to not only reduce the size of the bit line 3 and the bit line contact hole 11 while ensuring the design dimensions of the bit line 3 and the bit line contact hole 11 remain unchanged. The contact resistance between the line contact structures 2 can also increase the distance between the bit line contact structure 2 and the bit line 3 and adjacent conductive structures, so as to effectively reduce the parasitic capacitance. Therefore, the electrical properties of the semiconductor structure can be further improved, so as to further improve the reliability and yield of the semiconductor devices.

Please continue to refer to FIG. 3, in some embodiments, after the first epitaxial layer 41 and the second epitaxial layer 51 are formed in step S300, the preparation method further includes the following steps.

S400, forming an isolation structure on the sidewalls of the first epitaxial layer.

S500, forming sidewalls on the sidewalls of the second epitaxial layer and the sidewalls of the bit lines not covered by the second epitaxial layer.

Here, it should be understood that the execution of steps S400 and S500 is not strictly limited in sequence, and these steps may be executed simultaneously or in other sequences. Moreover, in the embodiment of the present disclosure, at least a part of the steps of the preparation method may include multiple sub-steps or multiple stages, and these sub-steps or stages are not necessarily executed and completed at the same moment, but may be performed at different moments. The execution order of these sub-steps or phases is not necessarily performed sequentially, but may be performed alternately or alternately with other steps or at least a part of the sub-steps or phases of other steps.

Figure 8:
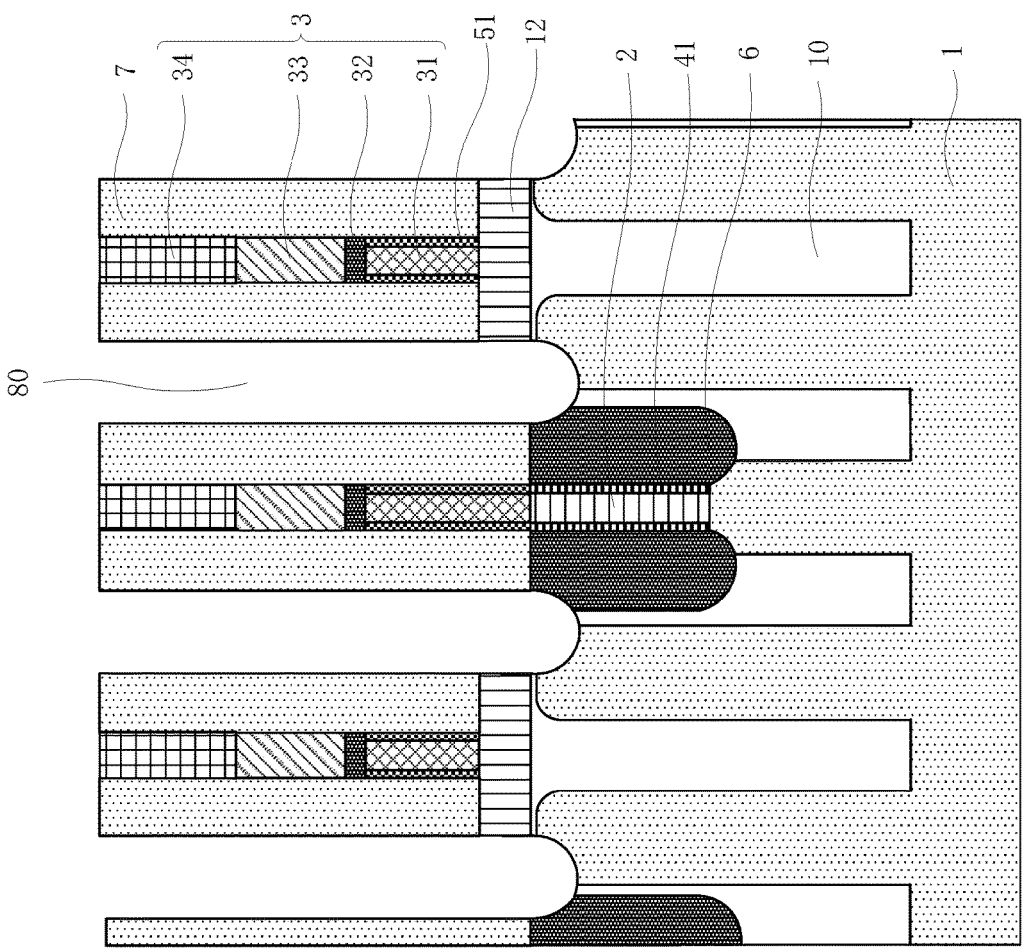
FIG. 8 is a schematic cross-sectional view of a structure obtained after forming an isolation structure and sidewalls provided in an embodiment.

In step S400, referring to FIG. 8, forming isolation structures on the sidewalls of the first epitaxial layer 41.

The above-mentioned isolation structure 6 can be formed by using a dielectric material with a relatively high dielectric constant, and the isolation structure 6 is, for example, a single-layer dielectric layer, or a stack of multiple dielectric layers. The isolation structure 6 may be formed by filling the trench G in the foregoing example. The isolation structure 6 is used to insulate the corresponding bit line contact structure 2, and the isolation structure 6 covers the sidewalls of the first epitaxial layer 41; the first epitaxial layer 41 can be a component of an equivalent bit line contact structure part to ensure that the size of the equivalent bit line contact structure can meet the design requirements. The equivalent bit line contact structure may include the bit line contact structure 2 and the first epitaxial layer 41 together.

In step S500, referring to FIG. 8, forming spacers on the sidewalls of the second epitaxial layer 51 and the sidewalls of the bit line 3 not covered by the second epitaxial layer 51.

The spacer 7 may be formed of a dielectric material with a lower dielectric constant, for example, the spacer 7 is a single-layer dielectric layer, or a stack of multiple dielectric layers. The spacers 7 are used to insulate the corresponding bit lines 3, and the spacers 7 cover the second epitaxial layer 51 and the side walls of the bit lines 3; that is to say, the second epitaxial layer 51 can be a component of an equivalent bit line part to ensure that the size of the equivalent bit line can meet the design requirements. In addition, the thickness of the side wall 7 can be selected and set according to actual needs.

Optionally, the isolation structure 6 and the sidewalls spacers 7 respectively adopt a structure formed by stacking a first silicon nitride layer, a silicon oxide layer and a second silicon nitride layer. The isolation structure 6 and the sidewalls 7 can be formed simultaneously.

In the embodiment of the present disclosure, the formation of the first epitaxial layer 41 and the second epitaxial layer 51 is arranged before the formation of the isolation structure 6 corresponding to the bit line contact structure 2 and the sidewalls spacer 7 corresponding to the bit line 3, which is beneficial to simplify the semiconductor structure. The manufacturing process of the semiconductor structure is improved, and the manufacturing difficulty of the semiconductor structure is reduced, so that the production efficiency and yield of the semiconductor structure can be improved.

Please understand with reference to FIG. 1, FIG. 3 and FIG. 8, in some embodiments, the preparation method further includes: S600, forming a storage node contact structure 8 which is insulated from the first epitaxial layer 41 by the isolation structure 6, and the storage node contact structure 8 is insulated from the second epitaxial layer 51 by the spacer 7.

It can be understood that the storage node contact structures 8 are generally formed within the corresponding storage node contact holes 80. Illustratively, storage node contact holes 80 may be formed on the resulting structure after forming the isolation structures 6 and the spacers 7 to form the storage node contact structures 8 within the storage node contact holes 80 and to form the storage node contact structures 8 located adjacent to the storage node contact holes 80. The insulating layer 9 between them is used to effectively insulate the adjacent storage node contact structures 8 by the insulating layer 9.

Optionally, the storage node contact structure 8 includes a first conductive layer 81, a conductive transition layer 82, a second barrier layer 83 and a second conductive layer 84 that are stacked in sequence along a direction away from the substrate 1. But it doesn't stop there. The first conductive layer 81 is, for example, a doped polysilicon layer. The conductive transition layer 82 is, for example, a cobalt silicide layer. The second barrier layer 83 is, for example, a titanium nitride layer. The second conductive layer 84 is, for example, a tungsten metal layer.

Optionally, the insulating layer 9 may be a silicon nitride layer, such as one or more silicon nitride layers. In addition, the insulating layer 9 may be formed at one time, or may be formed gradually in layers during the preparation of other layer structures. That is, the insulating layer 9 here refers to the entire insulating portion between adjacent storage node contact structures 8.

Figure 9:
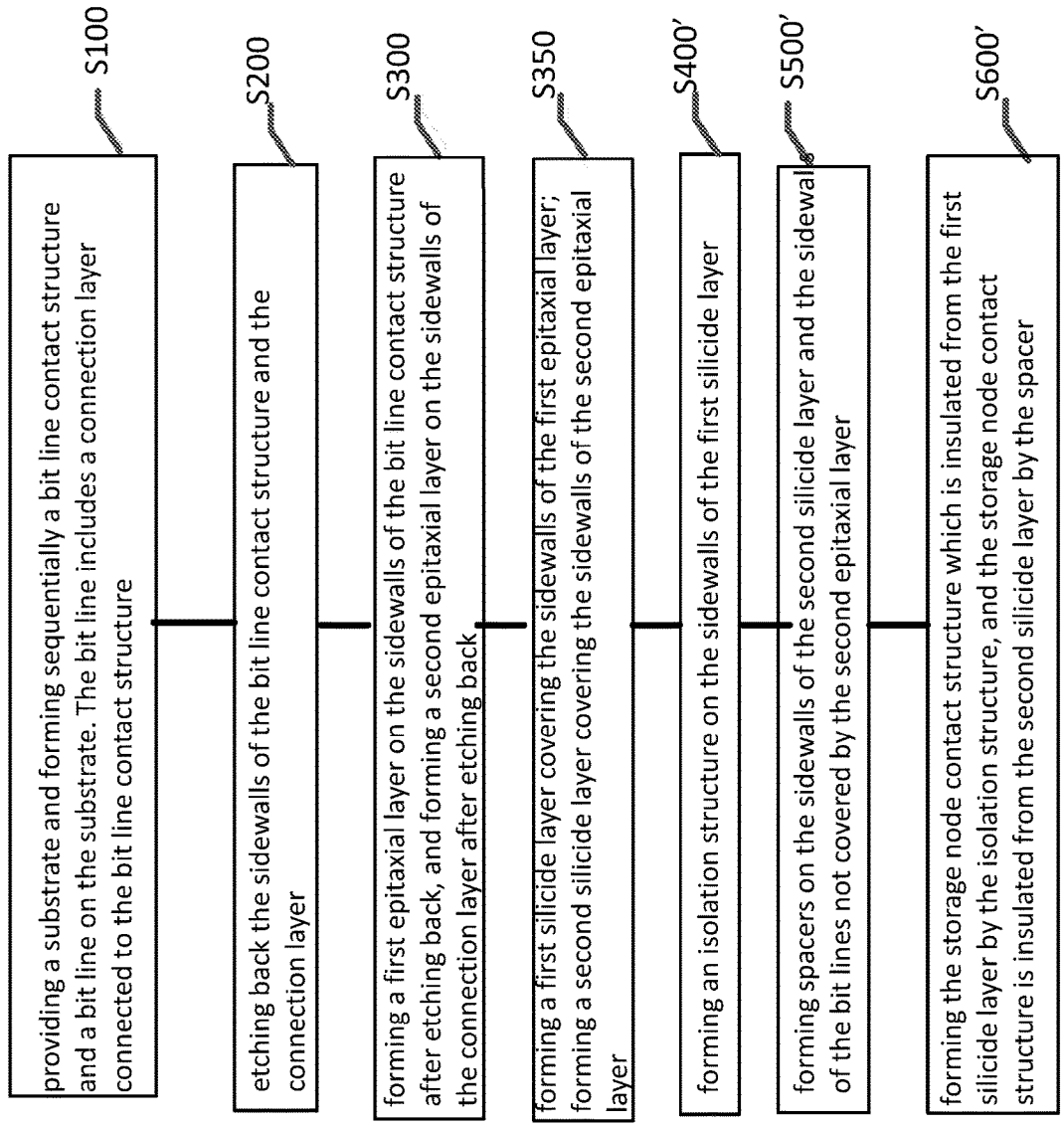
FIG. 9 is a schematic flowchart of a method for preparing the semiconductor structure shown in FIG. 2.

Referring to FIG. 9, some embodiments of the present disclosure further provide another method for fabricating a semiconductor structure, for fabricating the semiconductor structure shown in FIG. 2. The preparation method includes the following steps.

S100, providing a substrate, and forming sequentially a bit line contact structure and a bit line on the substrate. The bit line includes a connection layer connected to the bit line contact structure.

S200, etching back the sidewalls of the bit line contact structure and the connection layer.

S300, forming a first epitaxial layer on the sidewalls of the bit line contact structure after etching back, and forming a second epitaxial layer on the sidewalls of the connection layer after etching back.

S350, forming a first silicide layer covering the sidewalls of the first epitaxial layer; and forming a second silicide layer covering the sidewalls of the second epitaxial layer.

In the embodiment of the present disclosure, the first silicide layer is formed on the sidewalls of the first epitaxial layer, and the second silicide layer is formed on the sidewalls of the second epitaxial layer, and the first silicide layer and the second silicide can also be used. The layer effectively reduces the contact resistance between the bit line contact structure and the bit line, as well as the parasitic capacitance between each of the bit line contact structure and the bit line and the adjacent conductive structure. Therefore, the electrical properties of the semiconductor structure can be further improved, so as to further improve the reliability and yield of the semiconductor devices.

The foregoing steps S100 to S300 may be performed with reference to the corresponding steps in the foregoing embodiments, and only the differences between this embodiment and the foregoing embodiments will be described in detail below.

Figure 10:
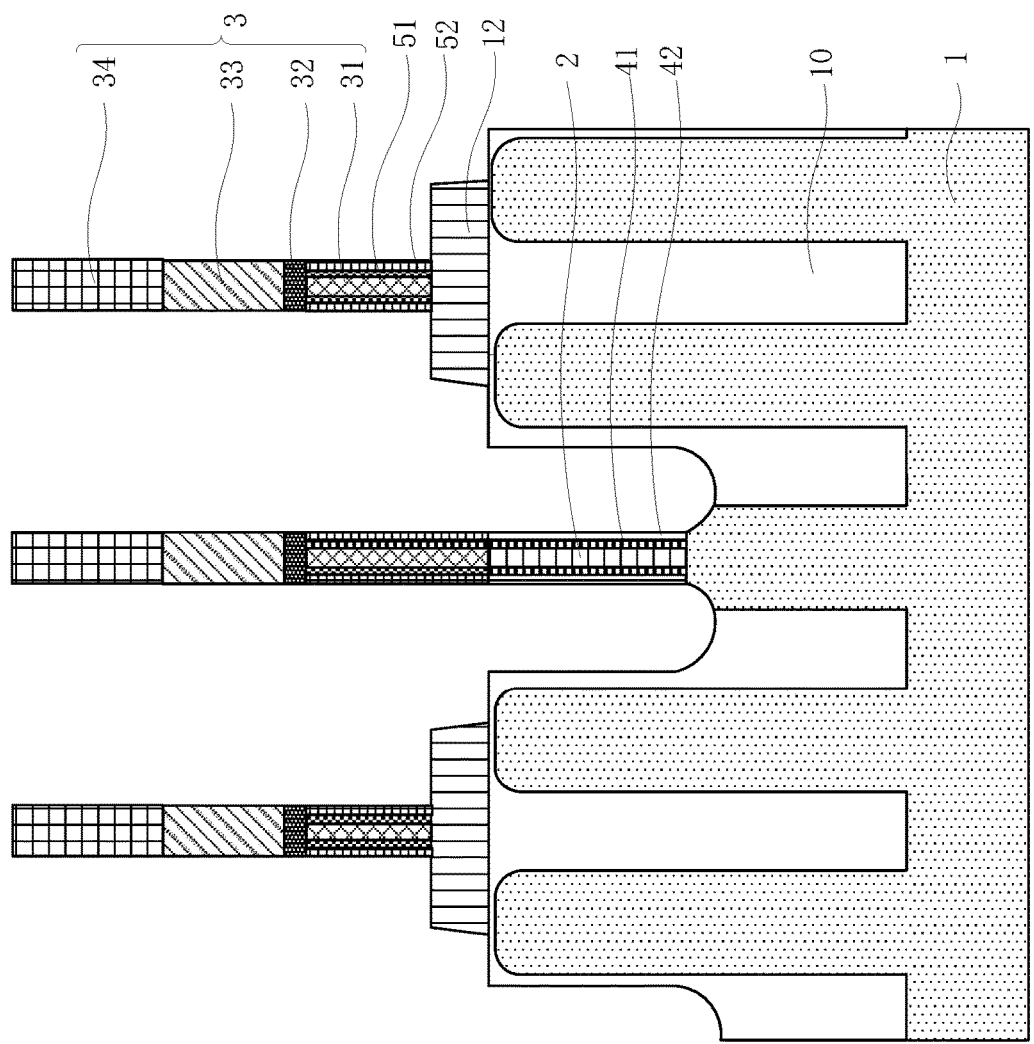
FIG. 10 is a schematic cross-sectional view of a structure obtained after forming a first silicide layer and a second silicide layer according to an embodiment.

In step S350, referring to S350 in FIG. 9 and FIG. 10, a first silicide layer 42 covering the sidewalls of the first epitaxial layer 41 is formed; and a second silicide layer 52 covering the sidewalls of the second epitaxial layer 51 is formed.

The first silicide layer 42 and the second silicide layer 52 may be the same silicide layer, or may be different silicide layers. Correspondingly, the first silicide layer 42 and the second silicide layer 52 may be formed simultaneously or in steps. This embodiment of the present disclosure does not limit this.

In some embodiments, please continue to refer to FIG. 10, the orthographic projections of the first silicide layer 42 and the second silicide layer 52 on the substrate 1 are at least within the range of the orthographic projection of the conductive layer 33 on the substrate 1.

Here, the orthographic projection of the first silicide layer 42 and the second silicide layer 52 on the substrate 1 is at least within the range of the orthographic projection of the conductive layer 33 on the substrate 1, including: the first silicide layer 42 and the second silicide layer 52, each of the silicide layers 52 includes a portion directly under the conductive layer 33 (i.e. vertically below), or the first silicide layer 42 and/or the second silicide layer 52 includes a portion directly under the conductive layer 33 (i.e. vertically below). In addition to the part directly under, it also includes the part whose orthographic projection is located outside the orthographic projection of the conductive layer 33 on the substrate 1.

Optionally, the orthographic projection of the second silicide layer 52 on the substrate 1 is located within the orthographic projection of the conductive layer 33 on the substrate 1. For example, there is a space between the orthographic projection of the second silicide layer 52 on the substrate 1 and the orthographic projection of the conductive layer 33 on the substrate 1.

Optionally, the thickness of the first silicide layer 42 and the thickness of the second silicide layer 52 may be the same or different. For example, the thickness of the first silicide layer 42 is equal to the thickness of the second silicide layer 52. Alternatively, for another example, the thickness of the first silicide layer 42 is greater than the thickness of the second silicide layer 52.

In the embodiment of the present disclosure, by setting the thicknesses of the first silicide layer 42 and the second silicide layer 52, it is possible to not only reduce the size of the bit line 3 while ensuring the design dimensions of the bit line 3 and the bit line contact hole 11 remain unchanged The contact resistance with the bit line contact structure 2 can also increase the distance between the bit line contact structure 2 and the bit line 3 and adjacent conductive structures, so as to effectively reduce the parasitic capacitance. Therefore, the electrical properties of the semiconductor structure can be further improved, so as to further improve the reliability and yield of the semiconductor devices.

It is worth mentioning that the first silicide layer 42 and the second silicide layer 52 can be formed simultaneously or in steps. Also, the first silicide layer 42 and the second silicide layer 52 may be deposited directly or obtained by performing a metallization process on a silicon-based material (eg, a single crystal silicon material or a silicon germanium material). In addition, the first silicide layer 42 and the second silicide layer 52 can be a single-layer structure or a multi-layer structure, which can be selected and set according to actual needs.

For the convenience of description, in the following embodiments, the first epitaxial layer 41 and the second epitaxial layer 51 are single crystal silicon layers as examples for illustration, and the preparation process of the first silicide layer 42 and the second silicide layer 52 is described in detail.

Figure 11:
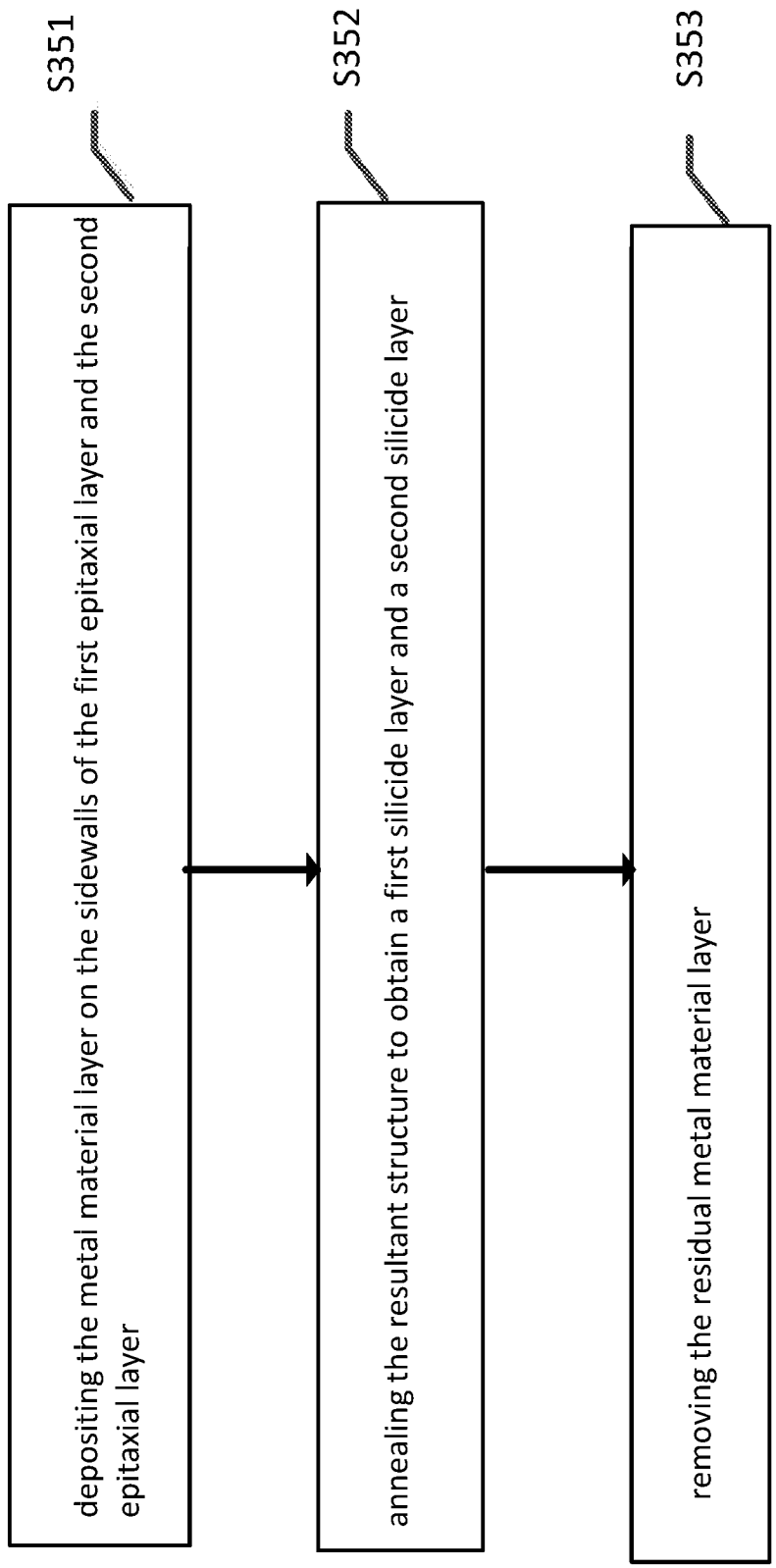
FIG. 11 is a schematic flowchart of step S350 according to an embodiment.

Referring to FIG. 11, in some embodiments, forming a first silicide layer covering the sidewalls of the first epitaxial layer and forming a second silicide layer covering the sidewalls of the second epitaxial layer in step S350 includes the following steps.

S351, depositing a metal material layer on the sidewalls of the first epitaxial layer and the second epitaxial layer.

S352, annealing the resultant structure to obtain a first silicide layer and a second silicide layer.

S353, removing the residual metal material layer.

Figure 12:
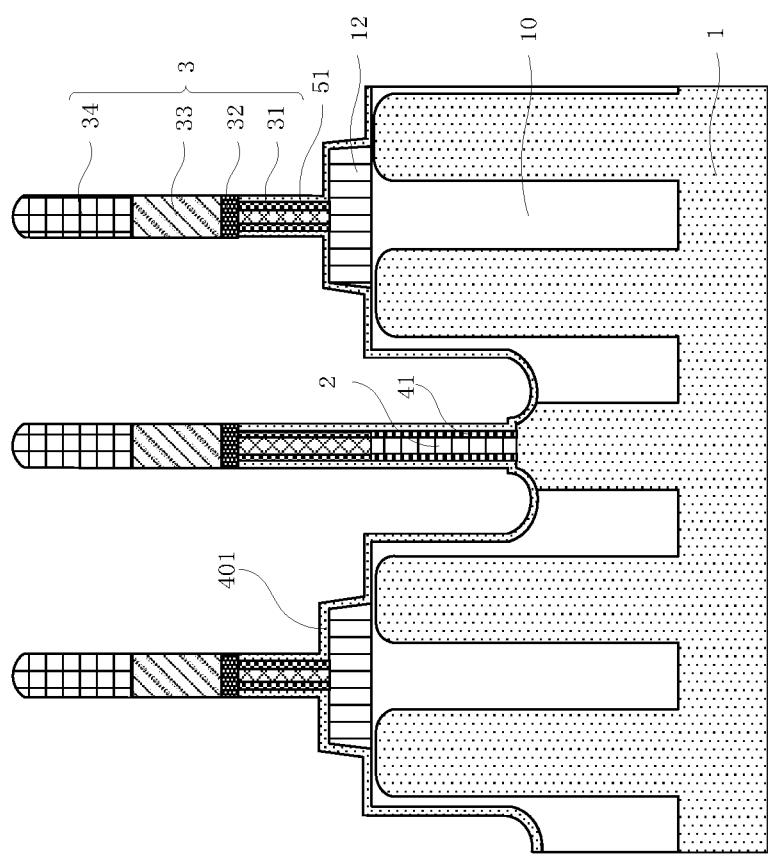
FIG. 12 is a schematic cross-sectional view of a structure obtained after forming a metal material layer according to an embodiment.

In step S351, referring to S351 and FIG. 12 in FIG. 11, a metal material layer 401 is deposited on the sidewalls of the first epitaxial layer 41 and the second epitaxial layer 51.

Here, the metal material layer 401 is, for example, a metal element layer or a metal compound layer. Alternatively, the metal material layer 401 may also be one material layer or multiple material layers. Optionally, the metal material layer 401 is a tantalum (Ta) metal layer, a stack of tantalum (Ta) and tantalum titanium (TaTi), a tungsten nitride (WN) material layer, a cobalt (Co) metal layer, or the like.

Figure 13:
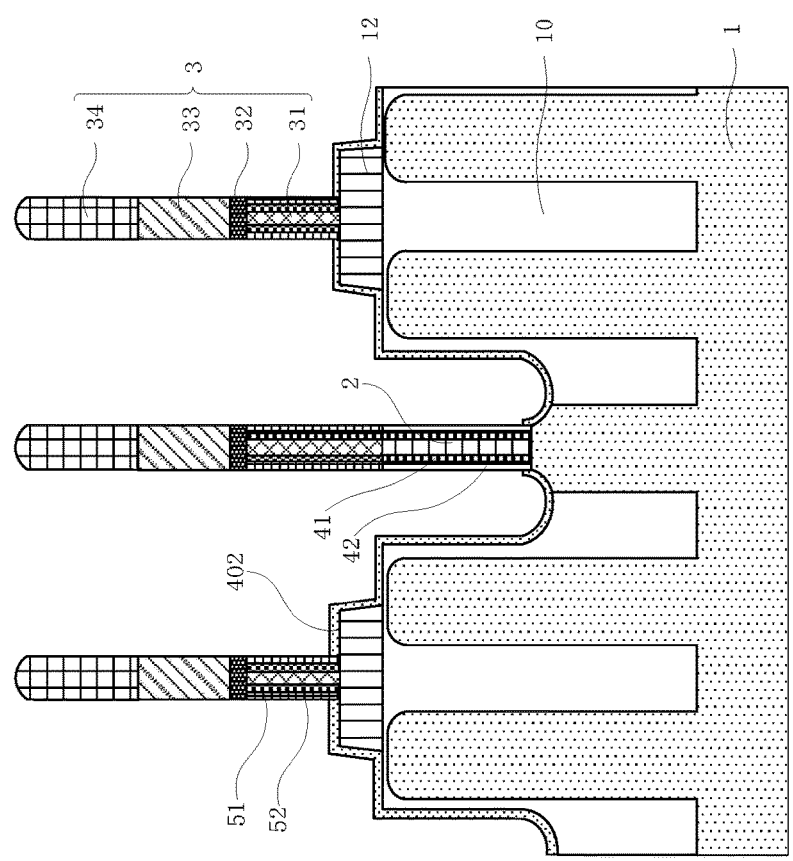
FIG. 13 is a schematic cross-sectional view of a structure obtained after annealing a metal material layer according to an embodiment.

In step S352, referring to S352 in FIG. 11 and FIG. 13, the obtained structure shown in FIG. 12 is annealed to obtain the first silicide layer 42 and the second silicide layer 52.

Here, it can be understood that after the structure shown in FIG. 12 is annealed, the portions of the metal material layer 401 located on the sidewalls of the first epitaxial layer 41 and the second epitaxial layer 51 can be correspondingly converted into silicide layers.

Optionally, the annealing temperature for annealing the obtained structure is 300° C. to 700° C. For example, the annealing temperature may be 300° C., 400° C., 500° C., 600° C. or 700° C.

In step S353, referring to S353 in FIG. 11 and FIG. 13, the remaining metal material layer 402 is removed.

Here, the residual metal material layer 402 means that the metal material layer 401 is transformed to form other parts than the first silicide layer 42 and the second silicide layer 52.

It is worth mentioning that, in some embodiments, the first silicide layer 42 and the second silicide layer 52 can be made of different materials and formed in steps. Based on this, in step S351, depositing the metal material layer 401 on the sidewalls of the first epitaxial layer 41 and the second epitaxial layer 51, may include: depositing a first metal material layer on the sidewalls of the first epitaxial layer 41; depositing a second metal material layer on the sidewalls of the second epitaxial layer 51; wherein, the first metal material layer or the second metal material layer includes: a single-layer metal material layer or a stack of multiple metal material layers. Correspondingly, after the first metal material layer and the second metal material layer are formed, steps S352 and S353 in the foregoing embodiments may be referred to as preparing the first silicide layer 42 and the second silicide layer 52. This embodiment of the present disclosure will not describe this in detail.

Continue to refer to FIG. 9, in some embodiments, after forming the first silicide layer covering the sidewalls of the first epitaxial layer and the second silicide layer covering the sidewalls of the second epitaxial layer in step S350, the fabrication method also includes the following steps.

S400', forming an isolation structure on the sidewalls of the first silicide layer.

S500', forming spacers on the sidewalls of the second silicide layer and the sidewalls of the bit lines not covered by the second epitaxial layer.

Here, it should be understood that the execution of steps S400' and S500' is not strictly limited in sequence, and these steps may be executed simultaneously or in other sequences.

Figure 14:
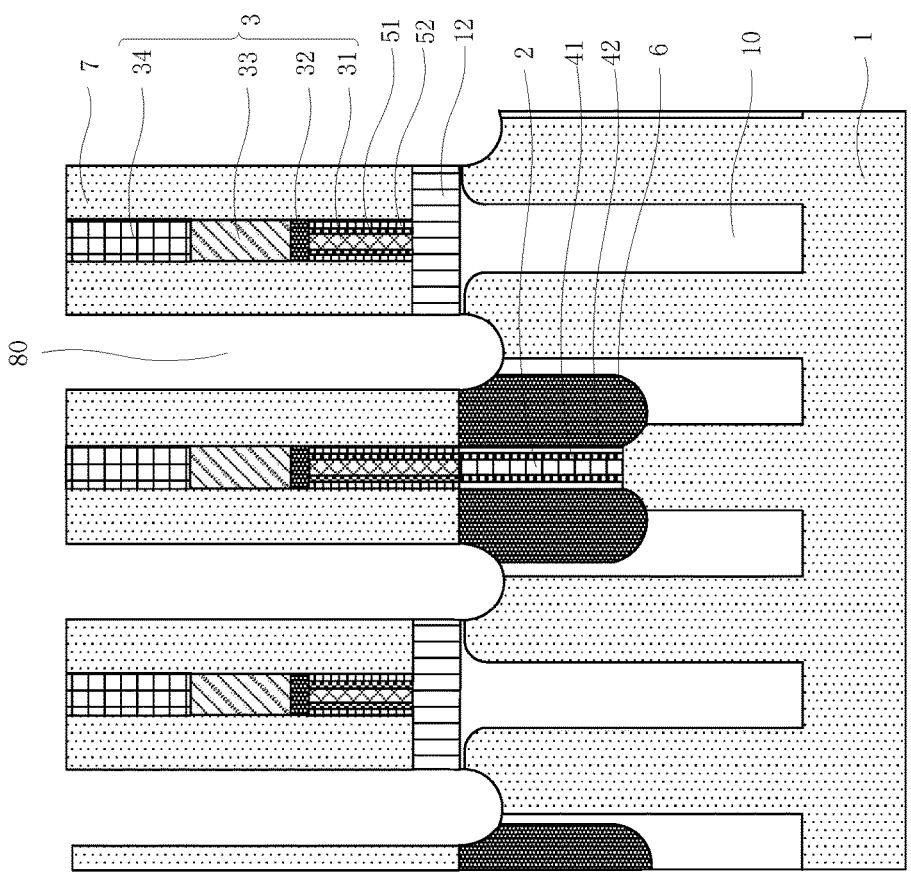
FIG. 14 is a schematic cross-sectional view of a structure obtained after forming an isolation structure and sidewalls according to another embodiment.

In step S400', referring to FIG. 14, isolation structures 6 are formed on the sidewalls of the first silicide layer 42.

The above-mentioned isolation structure 6 can be formed by using a dielectric material with a relatively high dielectric constant, and the isolation structure 6 is, for example, a single-layer dielectric layer, or a stack of multiple dielectric layers. The isolation structure 6 may be formed by filling the trench G in the foregoing example. The isolation structure 6 is used to insulate the corresponding bit line contact structure 2, and the isolation structure 6 covers the sidewalls of the first silicide layer 42, and the first silicide layer 42 covers the sidewalls of the first epitaxial layer 41. Both the first silicide layer 42 and the first epitaxial layer 41 can be an integral part of the equivalent bit line contact structure, so as to ensure that the size of the equivalent bit line contact structure can meet the design requirements. The equivalent bit line contact structure may include the bit line contact structure 2, the first epitaxial layer 41 and the first silicide layer 42 together.

In step S500', referring to FIG. 14, spacers 7 are formed on the sidewalls of the second silicide layer 52 and the sidewalls of the bit line 3 not covered by the second epitaxial layer 51.

The spacer 7 may be formed of a dielectric material with a lower dielectric constant, for example, the spacer 7 is a single-layer dielectric layer, or a stack of multiple dielectric layers. The spacer 7 is used to insulate the corresponding bit line 3, and the spacer 7 covers the second silicide layer 52 and the sidewalls of the bit line 3 not covered by the second epitaxial layer 51, and the second silicide layer 52 covers the second silicide layer 52. The sidewalls of the epitaxial layer 51; that is, the second silicide layer 52 and the second epitaxial layer 51 can be an integral part of the equivalent bit line to ensure that the size of the equivalent bit line can meet the design requirements. In addition, the thickness of the side wall 7 can be selected and set according to actual needs.

Optionally, the isolation structure 6 and the sidewalls spacers 7 respectively adopt a structure formed by stacking a first silicon nitride layer, a silicon oxide layer and a second silicon nitride layer. The isolation structure 6 and the sidewalls 7 can be formed simultaneously.

In the embodiment of the present disclosure, the formation of the first epitaxial layer 41 and the second epitaxial layer 51 is arranged before the formation of the first silicide layer 42 and the second silicide layer 52, and the first silicide layer 42 and the second silicide layer 52 are formed. The formation of the layer 52 is arranged before the formation of the isolation structure 6 corresponding to the bit line contact structure 2 and the sidewalls spacer 7 corresponding to the bit line 3, which is beneficial to simplify the preparation process of the semiconductor structure and reduce the preparation difficulty of the semiconductor structure, thereby improving the semiconductor structure. The production efficiency and yield of the structure.

Please understand with reference to FIG. 2, FIG. 9 and FIG. 14, in some embodiments, the method further includes: S600', forming the storage node contact structure 8. The storage node contact structure 8 is insulated from the first silicide layer 42 by the isolation structure 6, and the storage node contact structure 8 is insulated from the second silicide layer 52 by the spacer 7.

It can be understood that the storage node contact structures 8 are generally formed within the corresponding storage node contact holes 80. Illustratively, storage node contact holes 80 may be formed on the resulting structure after forming the isolation structures 6 and the spacers 7 to form the storage node contact structures 8 within the storage node contact holes 80 and to form the storage node contact structures 8 located adjacent to the storage node contact holes 80. The insulating layer 9 between them effectively insulates the adjacent storage node contact structures 8 by the insulating layer 9.

Optionally, the storage node contact structure 8 includes a first conductive layer 81, a conductive transition layer 82, a second barrier layer 83 and a second conductive layer 84 that are stacked in sequence along a direction away from the substrate 1. But it doesn't stop there. The first conductive layer 81 is, for example, a doped polysilicon layer. The conductive transition layer 82 is, for example, a cobalt silicide layer. The second barrier layer 83 is, for example, a titanium nitride layer. The second conductive layer 84 is, for example, a tungsten metal layer.

Optionally, the insulating layer 9 may be a silicon nitride layer, such as one or more silicon nitride layers. In addition, the insulating layer 9 may be formed at one time, or may be formed gradually in layers during the preparation of other layer structures. That is, the insulating layer 9 here refers to the entire insulating portion between adjacent storage node contact structures 8.

The semiconductor fabrication methods according to the embodiments of the present disclosure are used to fabricate the semiconductor structures in some of the foregoing embodiments. The technical advantages of the above-mentioned semiconductor structure are also possessed by the preparation method, which will not be described in detail here.

The technical features of the above-described embodiments can be combined arbitrarily. For the sake of brevity, all possible combinations of the technical features in the above-described embodiments are not described. However, as long as there is no contradiction between the combinations of these technical features, All should be regarded as the scope described in this specification.

The above-mentioned embodiments only represent several embodiments of the present disclosure, and the descriptions thereof are relatively specific and detailed, but should not be construed as limiting the scope of the patent application. It should be noted that, for those skilled in the art, without departing from the concept of the present disclosure, several modifications and improvements can be made, which all belong to the protection scope of the present disclosure. Accordingly, the scope of protection of the present disclosure should be determined by the appended claims.

The invention claimed is:

1. A semiconductor structure, comprising:
   a substrate having bit line contact holes;
   a bit line;
   a bit line contact structure disposed in one of the bit line contact holes;
   a first epitaxial layer, disposed on sidewalls of the bit line contact structure;
   a connection layer disposed in the bit line, wherein the connection layer connects to the bit line contact structure; and
   a second epitaxial layer disposed on sidewalls of the connection layer;
   a first silicide layer, disposed on the sidewalls of the first epitaxial layer; and
   a second silicide layer, disposed on the sidewalls of the second epitaxial layer.

2. The semiconductor structure of claim 1, further comprising:
   an isolation structure, disposed on sidewalls of the first epitaxial layer; and
   spacers, disposed on sidewalls of the second epitaxial layer and on the sidewalls of the bit line not covered by the second epitaxial layer.

3. The semiconductor structure of claim 1, further comprising:
   an isolation structure, disposed on sidewalls of the first silicide layer; and
   spacers, disposed on sidewalls of the second silicide layer and on the sidewalls of the bit line not covered by the second epitaxial layer.

4. The semiconductor structure of claim 1, wherein the bit line further comprises a conductive layer on a side of the connection layer away from the substrate; wherein an orthographic projection of the first epitaxial layer and an orthographic projection of the second epitaxial layer on the substrate each is at least located within an orthographic projection of the conductive layer on the substrate.

5. The semiconductor structure of claim 4, wherein the orthographic projection of the second epitaxial layer on the substrate is within the orthographic projection of the conductive layer on the substrate, and the orthographic projection of the second epitaxial layer is located within the orthographic projection of the conductive layer on the substrate; and wherein a gap exists between the orthographic projection of the second epitaxial layer on the substrate and the orthographic projection of the conductive layer on the substrate.

6. The semiconductor structure of claim 5, wherein the semiconductor structure further comprises a second silicide layer on sidewalls of the second epitaxial layer; wherein an orthographic projection of the second silicide layer on the substrate is located within the orthographic projection of the conductive layer on the substrate.

7. The semiconductor structure according to claim 1, wherein a thickness of the first epitaxial layer is greater than a thickness of the second epitaxial layer.

8. The semiconductor structure of claim 7, wherein the thickness of the second epitaxial layer is in a range of 2 nm~ 10 nm.

9. The semiconductor structure of claim 1, wherein a thickness of the connection layer is in arrange of 35%~ 65% of a thickness of the bit line.

10. A method for fabricating a semiconductor structure, comprising:
    providing a substrate, and forming a bit line contact structure and a bit line sequentially on the substrate, wherein the bit line comprises a connection layer connected to the bit line contact structure;
    etching back the bit line contact structure and sidewalls of a connection layer; and
    forming a first epitaxial layer on sidewalls of the bit line contact structure after the etching back, and forming a second epitaxial layer on the sidewalls of the connection layer after the etching back;
    the fabrication method further comprises:
    forming a first silicide layer covering the sidewalls of the first epitaxial layer; and
    a second silicide layer covering the sidewalls of the second epitaxial layer.

11. The method for fabricating the semiconductor structure according to claim 10, wherein the method further comprises:
    forming an isolation structure on sidewalls of the first epitaxial layer;
    forming spacers on sidewalls of the second epitaxial layer and sidewalls of the bit line not covered by the second epitaxial layer.

12. The method for fabricating the semiconductor structure according to claim 10, wherein
    the method further comprises:
    forming isolation structures on sidewalls of the first silicide layer; and
    forming spacers on sidewalls of the second silicide layer and sidewalls of the bit line not covered by the second epitaxial layer.

13. The method for fabricating the semiconductor structure according to claim 10, wherein the first epitaxial layer and the second epitaxial layer are epitaxially grown by an evaporation growth process, a molecular beam epitaxy process, or a chemical vapor deposition process.

14. The method for fabricating the semiconductor structure according to claim 10, wherein a thickness of the sidewalls of the bit line contact structure and the connection layer after the etching back is in a range of 2 nm~ 10 nm.

15. The method for fabricating the semiconductor structure according to claim 10, wherein the bit line further comprises a conductive layer on a side of the connection layer away from the substrate; and wherein the etching back of the bit line contact structure and the sidewalls of the connection layer is performed after the conductive layer is formed.

16. The method for fabricating the semiconductor structure according to claim 15, wherein a first epitaxial layer is formed on the sidewalls of the bit line contact structure after etching back, and a second epitaxial layer is formed on the sidewalls of the connection layer after etching back, and wherein each of an orthographic projection of the first epitaxial layer and an orthographic projection of the second epitaxial layer on the substrate is at least within an orthographic projection of the conductive layer on the substrate.

* * * * *